(12) United States Patent
Xu et al.

(10) Patent No.: US 7,193,849 B2
(45) Date of Patent: Mar. 20, 2007

(54) HEAT DISSIPATING DEVICE

(75) Inventors: Li-Fu Xu, Shenzhen (CN); Chih-Hao Yang, Tu-Chen (TW); Ching-Bai Hwang, Tu-Chen (TW)

(73) Assignees: Fu Zhun Precision Ind. (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 84 days.

(21) Appl. No.: 10/900,864

(22) Filed: Jul. 27, 2004

(65) Prior Publication Data

US 2005/0047088 A1   Mar. 3, 2005

(30) Foreign Application Priority Data

Aug. 27, 2003   (TW) .............................. 92215477 U

(51) Int. Cl.
*H05K 7/20*   (2006.01)
(52) U.S. Cl. ...................... 361/695; 361/704; 165/80.3
(58) Field of Classification Search ................ 361/695, 361/704; 165/80.3
See application file for complete search history.

(56) References Cited

U.S. PATENT DOCUMENTS

| | | | | | |
|---|---|---|---|---|---|
| 5,384,940 | A | * | 1/1995 | Soule et al. | .................. 24/453 |
| 5,519,575 | A | * | 5/1996 | Chiou | ......................... 361/697 |
| 5,584,339 | A | * | 12/1996 | Hong | ........................ 165/80.3 |
| 5,661,638 | A | | 8/1997 | Mira | |
| 5,740,014 | A | * | 4/1998 | Lin | ............................ 361/697 |
| 5,794,685 | A | * | 8/1998 | Dean | ........................... 165/121 |
| 6,023,413 | A | * | 2/2000 | Umezawa | .................... 361/697 |
| 6,367,542 | B1 | | 4/2002 | Chen | |
| 6,666,640 | B1 | * | 12/2003 | Hsieh | ......................... 165/80.3 |
| 6,691,769 | B2 | * | 2/2004 | Johnson et al. | ............ 165/80.3 |

* cited by examiner

*Primary Examiner*—Nichael Datskovsky
*Assistant Examiner*—Robert J. Hoffberg
(74) *Attorney, Agent, or Firm*—Wei Te Chung

(57) ABSTRACT

A heat dissipating device is adapted to remove heat from an electronic package. The heat dissipating device includes a fan (1) for generating airflow and a heat sink (2). The heat sink has a base (21) and a plurality of fins (22). A chamber (25) is defined with the fins surrounding for receiving the fan. At least one channel (23) is defined in the base for allowing airflow directly blowing on the electronic package under the heat sink.

14 Claims, 5 Drawing Sheets

HEAT DISSIPATING DEVICE

BACKGROUND OF THE INVENTION

1. Field of the Invention

The present invention relates to a heat dissipating device, and particularly to a heat dissipating device which is attached to an electronic package to remove heat therefrom.

2. Prior Art

Electronic devices such as central processing units (CPUs) generate a lot of heat during normal operation. This can deteriorate their operational stability and damage associated electronic devices. Thus the heat must be removed quickly to ensure normal operation.

FIG. 4 shows a conventional heat dissipation device 20. The heat dissipation device 20 comprises a flat base 220 a plurality of fins 240 extending from the base 220 and a fan 260 mounted on the fins 240. During operation of the heat dissipation device 20, the fan 260 draws ambient cooling air to the heat dissipation device 20. The air flows down in channels defined between the fins 240 for heat exchange with the fins 240. When the air arrives at the base 220, some of it simply refluxes instead of exiting from the channel. When the refluxed air meets downward flowing air, the downward flowing air is prevented. Thus an overall speed and efficiency of cooling airflow is retarded. This can seriously affect the heat dissipation capability of the heat dissipation device.

FIG. 5 shows an improved heat dissipation device. The heat sink includes a base 120 and a plurality of fins 14. The base 120 has a first surface in thermal contact with an electronic package arid a pair of sloped beat dissipation surfaces. The fins 14 are perpendicularly attached on the heat dissipation surfaces. The fan 30 is supported on the heat sink. During operation of the heat dissipation device, the cooling air is drawn into the heat sink by the fan 30 and exits the heat sink along the heat dissipation surface. However, this improved heat dissipation device has complex structure. It is not adapted to mass manufacture.

SUMMARY OF THE INVENTION

Accordingly, an object of the present invention is to provide a heat dissipating device which provides fluent airflow for good heat dissipation capability.

Another object of the present invention is to provide a heat dissipating device which has simple structure.

To achieve the above-mentioned objects, a heat dissipating device in accordance with the present invention comprises a fan for generating airflow and a heat sink. The heat sink has a base and a plurality of fins. A chamber is defined with the fins surrounding for receiving the fan. At least one channel is defined in the base for allowing airflow directly blowing on the electronic package under the heat sink.

Other objects, advantages and novel features of the present invention will be drawn from the following detailed description of a preferred embodiment of the present invention with attached drawings, in which:

DETAILED DESCRIPTION OF THE INVENTION

Figure 1:
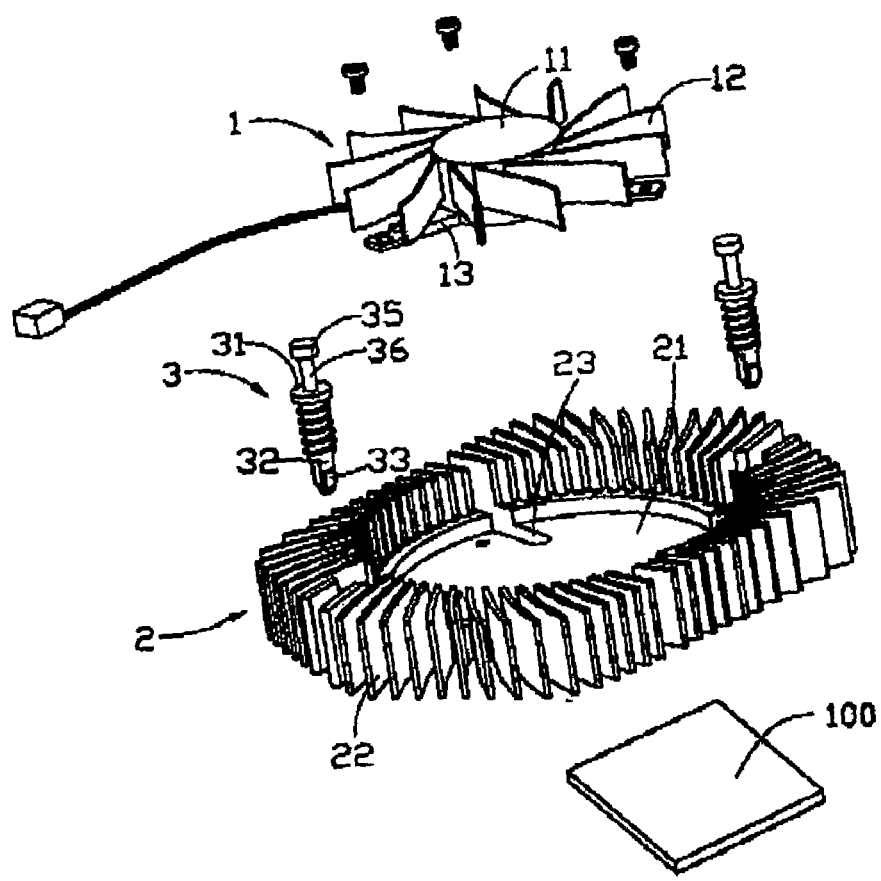
FIG. 1 is an exploded view of a heat dissipating device in accordance with a preferred embodiment of the present invention.

Referring to FIG. 1, a heat dissipating device in accordance with the preferred embodiment of the present invention comprises a fan 1, a heat sink 2 and a pair of fasteners 3. The heat dissipating device is adapted for removing heat from an electronic package 100 thereunder.

The fan 1 has an impeller 11 and a plurality of blades 12 radially mounted thereon. The fan 1 has four legs 13 with holes defined thereon, for mounting the fan 1 on the heat sink 2 with screws (not labeled).

Figure 2:
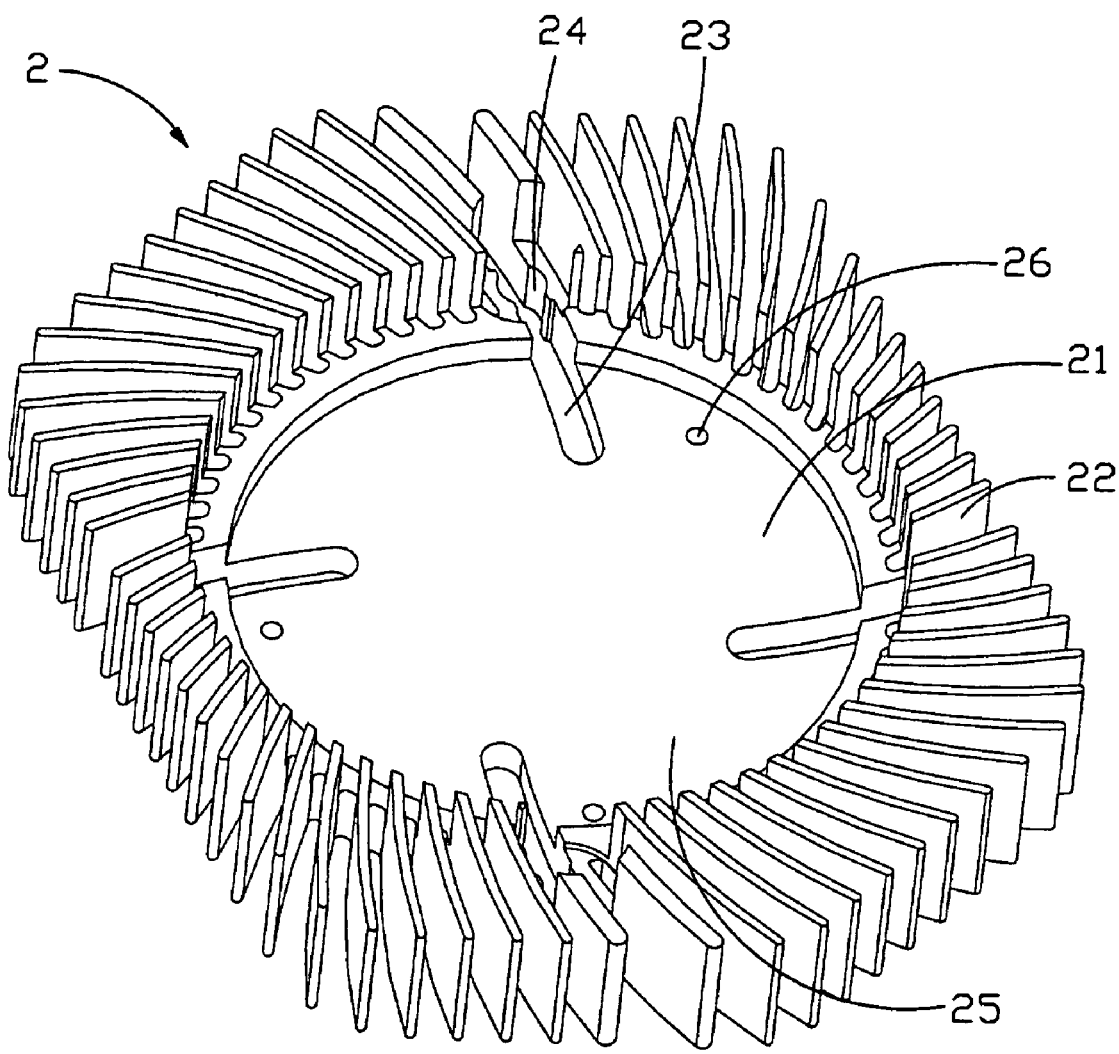
FIG. 2 is an isometric view of a heat sink of the heat dissipating device in FIG. 1.
Figure 3:
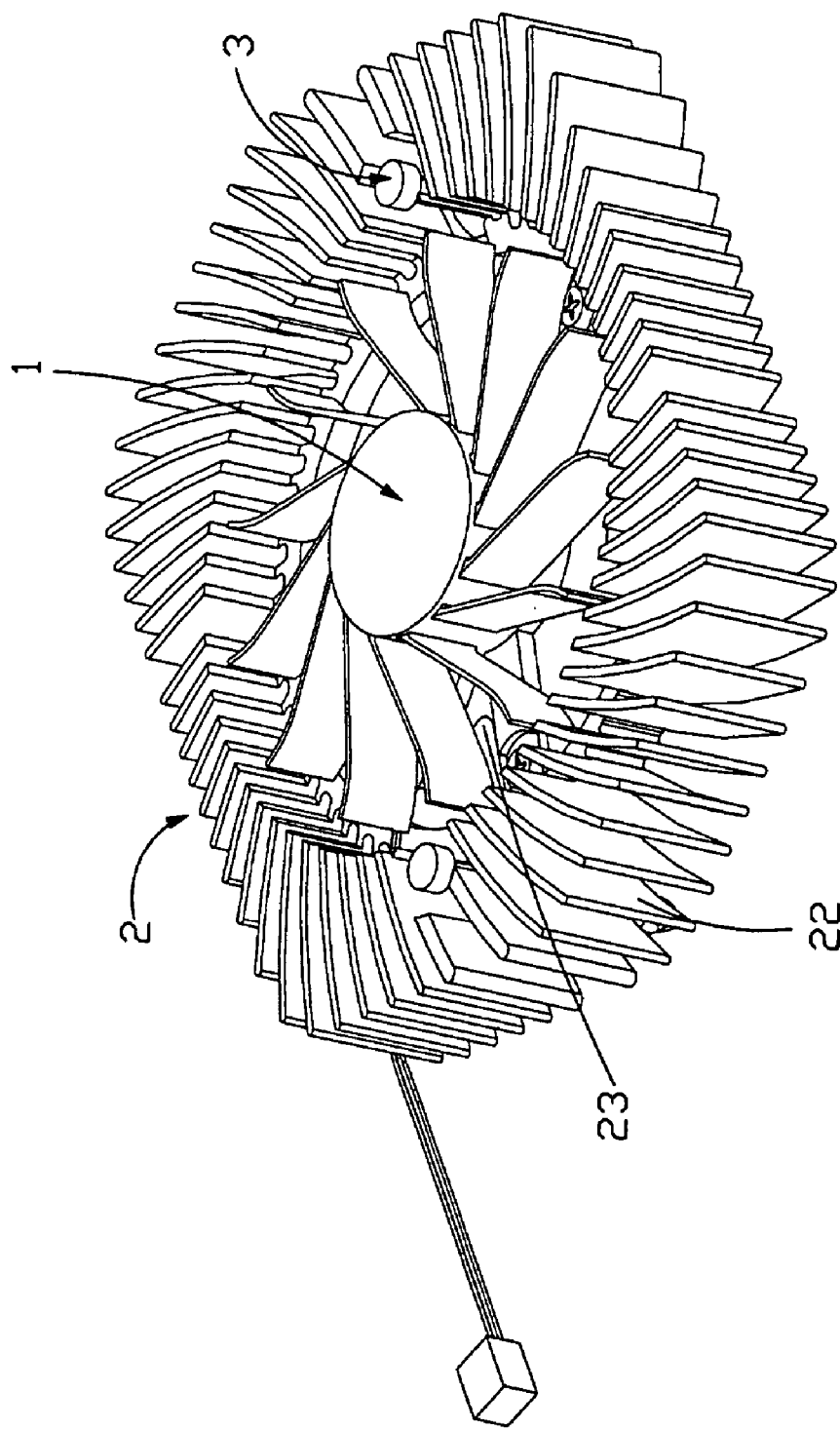
FIG. 3 is an assembled view of a heat dissipating device in FIG. 1.
Figure 4:
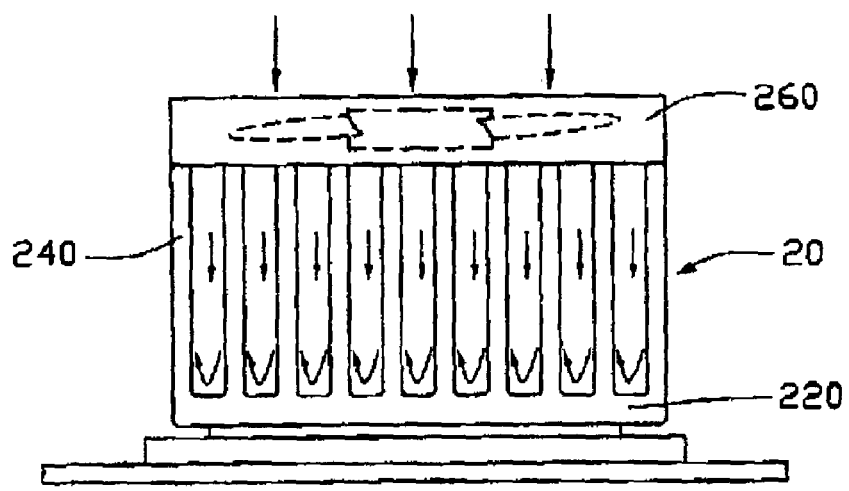
FIG. 4 is an isometric view of a conventional heat dissipating device.
Figure 5:
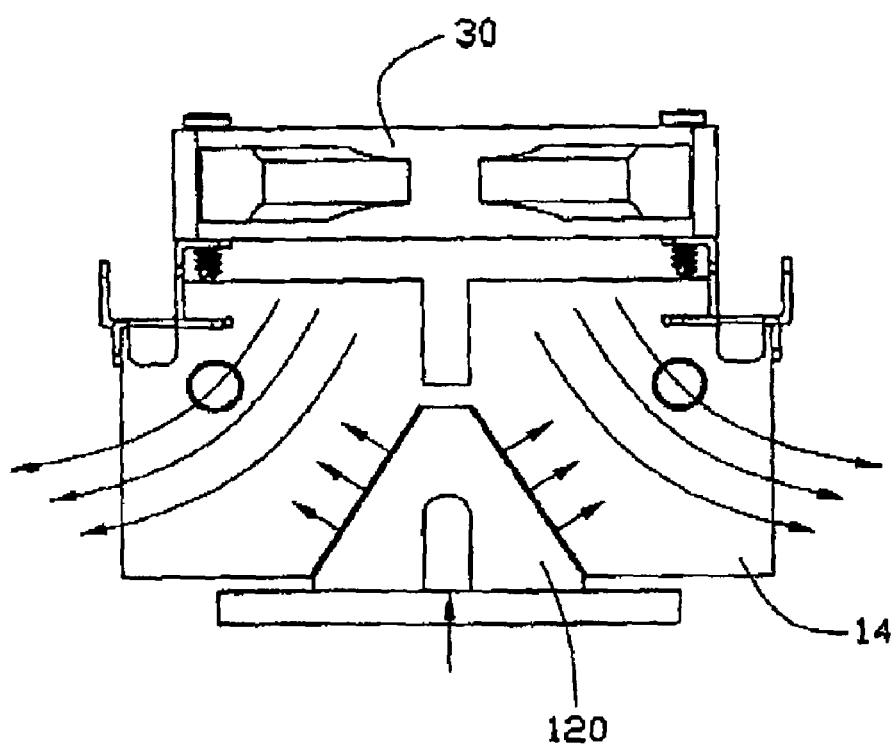
FIG. 5 is an isometric view of another conventional heat dissipating device.

Referring to FIG. 2, the heat sink 2 includes a circular base 21 and a plurality of curved fins 22 radially and upwardly extending from a periphery of the base 21. The base 21 has an upper surface and a lower surface. The lower surface of the base 21 touches the electronic package 100. With the fins 22 surrounding, a chamber is defined therein for receiving the fan 1. Between every two adjacent fins 22, an airflow passage is formed. Four channels 23 are quarterly defined in the periphery of the base 21, and extend inwardly therefrom to an inner portion of the base 21. Each channel 23 communicates with a corresponding airflow passage between a pair of the fins 22. A hole 24 is defined with communication with each channel 23 and acts as a passage for the fastener 3 to extend therethrough when the fastener 3 is used to attach the heat sink 2 to the electronic package 100. On the base 21, a hole 26 is defined adjacent to each channel 23 for securing the fan 1. The heat sink 2 can be made of any efficient thermal conductive material, such as copper, aluminum.

Referring to FIG. 1, each fastener 3 includes a head 35, a shaft 36 and a taper end 32. On the shaft 36, a ring 31 is formed adjacent to the head 35. The taper end 32 is split and a groove is defined therein. Thus, the taper end 32 has contractibility to go through a hole of reduced size. A catch 33 is formed at both sides of the taper end 32 for locking.

In assembly, the fan 1 is put into the chamber 25 of the heat sink 2. The screws insert into the holes on the legs 13 of the fan 1 and the holes 26 on the base 21 of the heat sink 2, and secure the fan 1 in the heat sink 2. Then, the assembly of the fan 1 and the heat sink 2 is put on the electronic package 100 on a circuit board (not shown). The fasteners 3 insert into the hales 24 an the heat sink 2 and holes on the circuit board, and secure the assembly of the fan 1 and the heat sink 2 on the circuit board. Alternatively, the fasteners 3 insert directly through the channel 23 and secure the assembly thereon.

In the present invention, airflow generated by the fan 1 either escapes from the air passages between the fins 22, or blows directly on the electronic package 100 through the channels 23. The airflow reflux is significantly reduced.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipating device for removing heat from an electronic package, comprising:
   a fan for generating airflow;
   a heat sink adapted to attach on the electronic package, the heat sink comprising a base and a plurality of fins, a chamber being defined with the fins surrounding for receiving the fan, at least one channel defined in the base for allowing airflow from the fan directly flowing through the base to blow the electronic package under the heat sink; and
   a pair of fasteners for attaching the heat sink to the electronic package;
   wherein the at least one channel in the base of the heat sink provides a passage for the fastener extending through when the fastener attaches the heat sink to the electronic package.

2. The heat dissipating device as claimed in claim 1, wherein the fastener has a taper end with a groove defined therein to thereby split the end.

3. The heat dissipating device as claimed in claim 1, wherein the fastener has a head and a shaft.

4. The heat dissipating device as claimed in claim 3, wherein a spring encloses the shaft.

5. The heat dissipating device as claimed in claim 1, wherein the at least one channel in the base of the hear sink communicates with at least one airflow passage between the fins.

6. The heat dissipating device as claimed in claim 1, wherein the base of the heat sink is circular and the fins radially extending therefrom.

7. The heat dissipating device as claimed in claim 1, wherein the at least one channel is defined in a periphery of the base and extends therefrom to an inner portion of the base.

8. The heat dissipating device as claimed in claim 7, wherein the at least one channel is in communication with an airflow passage defined between a pair of the fins.

9. The heat sink as claimed in claim 1, wherein the at least one channel includes a plurality of channels.

10. A heat sink for removing heat from an electronic package, comprising a base and a plurality of fins, a chamber being defined above the base with the fins surrounding for receiving a fan, at least one channel being defined in the base for allowing airflow from the fan directly blowing to the electronic package under the heat sink, wherein the at least one channel in the base of the heat sink provides a passage for a fastener extending therethrough to attach the heat sink to the electronic package.

11. The heat sink as claimed in claim 10, wherein the at least one channel in the base of the heat sink communicates with at least one airflow passage between the fins.

12. The heat sink as claimed in claim 10, wherein the base of the heat sink is circular and the fins radially extending therefrom.

13. The heat sink as claimed in claim 10, wherein the at least one channel is defined inn periphery of the base and extends inwardly therefrom to an inner portion of the base.

14. The heat sink as claimed in claim 13, wherein the at least one channel is in communication with an airflow passage defined between a pair of the fins.

\* \* \* \* \*